(12) United States Patent
Lee

(10) Patent No.: US 8,295,659 B2
(45) Date of Patent: *Oct. 23, 2012

(54) ANTI-RESONANT REFLECTING OPTICAL WAVEGUIDE FOR IMAGER LIGHT PIPE

(75) Inventor: Hong-Wei Lee, Meridian, ID (US)

(73) Assignee: Aptina Imaging Corporation, George Town (KY)

( * ) Notice: Subject to any disclaimer, the term of this patent is extended or adjusted under 35 U.S.C. 154(b) by 151 days.

This patent is subject to a terminal disclaimer.

(21) Appl. No.: 12/884,233

(22) Filed: Sep. 17, 2010

(65) Prior Publication Data

US 2011/0006193 A1   Jan. 13, 2011

Related U.S. Application Data

(63) Continuation of application No. 11/984,623, filed on Nov. 20, 2007, now Pat. No. 7,822,300.

(51) Int. Cl.
*G02B 6/12* (2006.01)
*G01J 1/04* (2006.01)

(52) U.S. Cl. ......... 385/14; 385/15; 385/31; 250/227.11; 257/290

(58) Field of Classification Search .................. None
See application file for complete search history.

(56) References Cited

U.S. PATENT DOCUMENTS

| | | | |
|---|---|---|---|
| 3,813,605 A | 5/1974 | Szoke | |
| 5,552,597 A | 9/1996 | McConica | |
| 5,986,746 A | 11/1999 | Metz et al. | |
| 6,987,258 B2 | 1/2006 | Mates | |
| 7,822,300 B2 * | 10/2010 | Lee | ................................ 385/14 |
| 2004/0252867 A1 | 12/2004 | Lan et al. | |
| 2005/0087601 A1 | 4/2005 | Gerst, III et al. | |
| 2005/0116271 A1 | 6/2005 | Kato | ............................ 257/292 |
| 2005/0145701 A1 | 7/2005 | Silverbrook et al. | |
| 2005/0276556 A1 | 12/2005 | Williams et al. | |
| 2005/0284181 A1 | 12/2005 | Smith et al. | |

(Continued)

FOREIGN PATENT DOCUMENTS

DE   41 06 201 A1   9/1992

(Continued)

OTHER PUBLICATIONS

M. A. Duguay et al., "Antiresonant Reflecting Optical Waveguides in $SiO_2$-Si Multilayer Structures," Appl. Phys. Lett., 49 (1), Jul. 7, 1986, pp. 13-15.

S. Olivier et al., "Cascaded Photonic Crystal Guides and Cavities: Spectral Studies and Their Impact on Integrated Optics Design," IEEE Journal of Quantum Electronics, vol. 38, No. 7, Jul. 2002, pp. 816-824.

(Continued)

*Primary Examiner* — Sarah Hahm

(57) ABSTRACT

An anti-resonant reflecting optical waveguide structure for reducing optical crosstalk in an image sensor and method of forming the same. The method includes forming a trench within a plurality of material layers and over a photo-conversion device. The trench is vertically aligned with the photo-conversion device and is filled with materials of varying refractive indices to form an anti-resonant reflecting optical waveguide structure. The anti-resonant reflecting optical waveguide structure has a core and at least two cladding structures. The cladding structure in contact with the core has a refractive index that is higher than the refractive index of the core and the refractive index of the other cladding structure. The cladding structures act as Fabry-Perot cavities for light propagating in the transverse direction, such that light entering the anti-resonant reflecting optical waveguide structure remains confined to the core. This reduces the chance of photons impinging upon neighboring photo-conversion devices.

20 Claims, 12 Drawing Sheets

U.S. PATENT DOCUMENTS

| | | |
|---|---|---|
| 2006/0032921 A1 | 2/2006 | Gerst, III et al. |
| 2006/0039653 A1 | 2/2006 | Painter et al. |
| 2006/0250605 A1 | 11/2006 | Chern et al. |
| 2007/0009216 A1 | 1/2007 | Russell et al. |
| 2007/0090193 A1 | 4/2007 | Nunnink et al. |
| 2007/0122097 A1 | 5/2007 | Schmidt et al. |
| 2007/0147728 A1 | 6/2007 | Schmidt et al. |
| 2007/0275496 A1 | 11/2007 | Yamashita et al. .............. 438/57 |

FOREIGN PATENT DOCUMENTS

| | | |
|---|---|---|
| JP | 2003-249633 | 9/2003 |
| JP | 2004-207433 | 7/2004 |
| JP | 2005-166919 | 6/2005 |
| JP | 2005-209676 | 8/2005 |
| WO | WO 2004/113957 A2 | 12/2004 |

OTHER PUBLICATIONS

D. Yin et al., "Integrated Optical Waveguides with Liquid Cores," Appl. Phys. Lett., vol. 85, No. 16, Oct. 18, 2004, pp. 3477-3479.

M. Vrhel et al., "Color Image Generation and Display Technologies," IEEE Signal Processing Magazine, vol. 22, No. 1, Jan. 2005, pp. 23-33.

John P. Barber et al., "Fabrication of Hollow Waveguides with Sacrificial Aluminum Cores," IEEE Photonics Technology Letters, vol. 17, No. 2, Feb. 2005, pp. 363-365.

J. Gambino et al., "CMOS Imager with Copper Wiring and Lightpipe," IEEE Electron Devices Meeting, 2006, Dec. 2006, pp. 1-4.

PCT International Preliminary Report on Patentability, May 2010.

* cited by examiner

ANTI-RESONANT REFLECTING OPTICAL WAVEGUIDE FOR IMAGER LIGHT PIPE

This application is a continuation of U.S. patent application Ser. No. 11/984,623, filed Nov. 20, 2007 now U.S. Pat. No. 7,822,300 and presently allowed, which is incorporated herein in its entirety.

FIELD OF THE INVENTION

Embodiments of the invention relate generally to the field of semiconductor devices and more particularly to a light pipe having an anti-resonant reflecting optical waveguide structure and method of forming the same.

BACKGROUND OF THE INVENTION

The semiconductor industry uses different types of semiconductor-based image sensors, including charge coupled devices (CCDs), photodiode arrays, charge injection devices (CIDs), hybrid focal plane arrays, and complementary metal oxide semiconductor (CMOS) image sensors. Current applications of such image sensors include cameras, scanners, machine vision systems, vehicle navigation systems, video telephones, computer input devices, surveillance systems, auto focus systems, star trackers, motion detector systems, image stabilization systems, and other image acquisition and processing systems.

Semiconductor image sensors include an array of pixel cells. Each pixel cell contains a photo-conversion device for converting incident light to an electrical signal. The electrical signals produced by the array of photo-conversion devices are processed to render a digital image. The amount of charge generated by the photo-conversion device corresponds to the intensity of light impinging on the photo-conversion device. Accordingly, it is important that all of the light directed to a photo-conversion device impinges on the photo-conversion device rather than being reflected or refracted toward another photo-conversion device, which would produce optical crosstalk.

For example, optical crosstalk may exist between neighboring photo-conversion devices in a pixel array. Ideally, all incident photons on a pixel cell are directed towards the photo-conversion device corresponding to that pixel cell. In reality, some of the photons are refracted and reach adjacent photo-conversion devices producing optical crosstalk.

Optical crosstalk can bring about undesirable results in the images produced by imaging devices. The undesirable results can become more pronounced as the density of pixel cells in image sensors increases and as pixel cell size correspondingly decreases. Optical crosstalk can cause a blurring or reduction in contrast in images produced by the imaging device. Optical crosstalk can also degrade the spatial resolution, reduce overall sensitivity, cause color mixing, and lead to image noise after color correction.

FIGS. 1A and 1B are schematic cross-sectional views of a portion of an optical waveguide aimed at reducing optical crosstalk, which has an optically transparent core 10 surrounded by, or enclosed within, a cladding structure 20. The cladding structure 20 has a lower refractive index than the refractive index of the core 10. Light introduced into an end of the core 10 undergoes total internal reflection at the refractive boundary, causing the light to be guided along an axis of the core 10. Total internal reflection, however, occurs only when the angle of incidence $\theta$ (FIG. 1A) is larger than a critical angle $\theta c$. The angle of incidence $\theta$ is measured with respect to the normal at the refractive boundary. If light strikes the refractive boundary at an angle $\theta$ (FIG. 1B) smaller than the critical angle $\theta c$, optical leakage and power loss occur resulting in optical crosstalk and reduced quantum efficiency, which are undesirable. Accordingly, there is a need and desire for an improved method and structure for reducing optical crosstalk in imaging sensors.

DETAILED DESCRIPTION OF THE INVENTION

In the following detailed description, reference is made to certain embodiments, which are described with sufficient detail to enable those skilled in the art to practice them. It is to be understood that other embodiments may be employed, and that various structural, logical and electrical changes may be made.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

The term "pixel" or "pixel cell" refers to a picture element unit cell containing a photo-conversion device for converting electromagnetic radiation to an electrical signal. Typically, the fabrication of all pixel cells in an image sensor will proceed simultaneously in a similar fashion.

Although embodiments are described herein with reference to the architecture and fabrication of one or a limited number of pixel cells, it should be understood that this description is representative for a plurality of pixel cells that typically would be arranged in an array having pixel cells arranged, for example, in rows and columns.

Figure 1A:
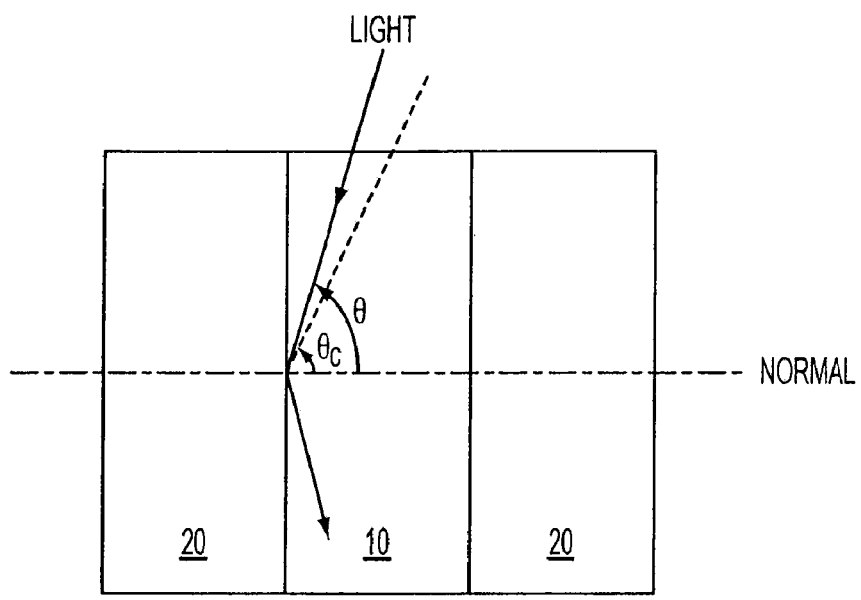
FIGS. 1A and 1B are schematic cross-sectional views of a portion of an optical waveguide that utilizes the principle of total internal reflection.
Figure 1B:
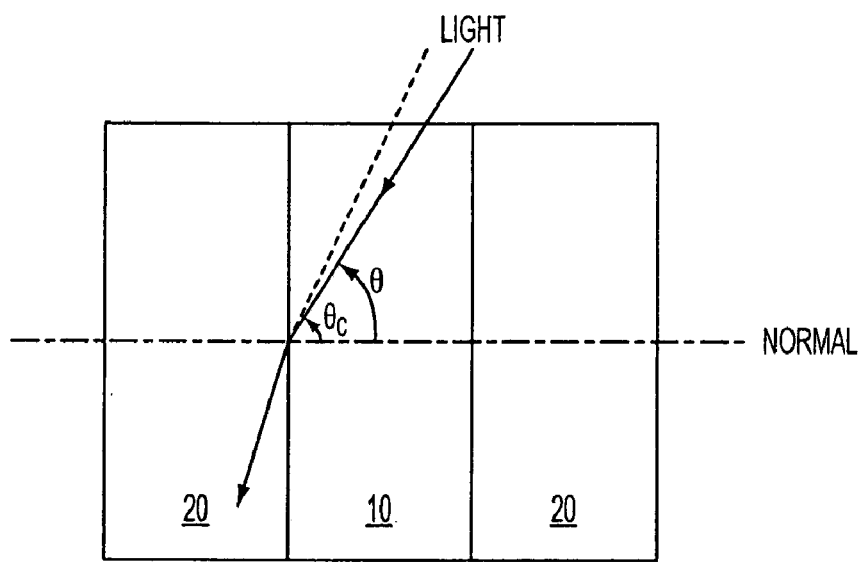
Figure 2:
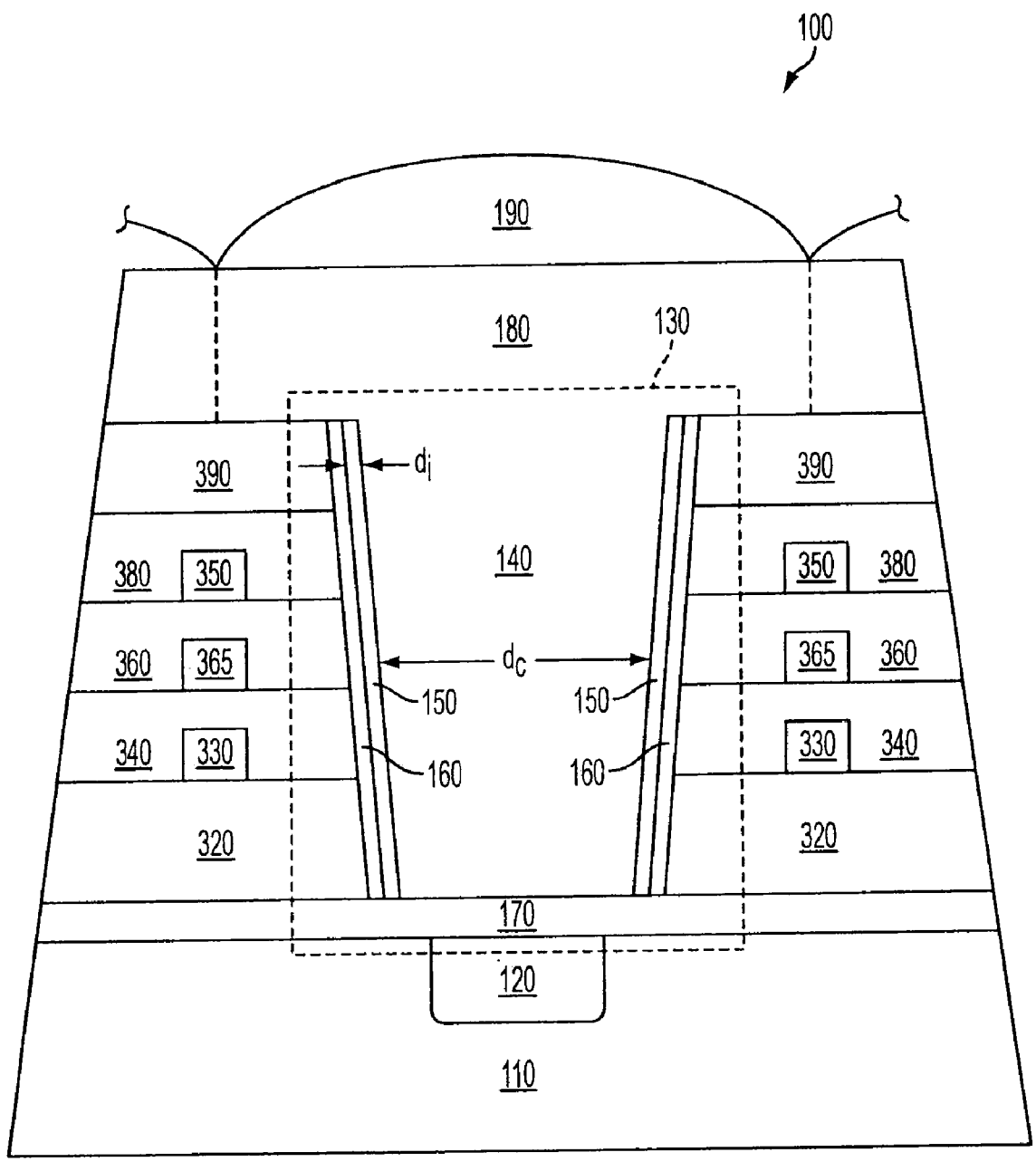
FIG. 2 is a schematic cross-sectional view of a pixel cell having an optical waveguide that utilizes the anti-resonant reflecting optical waveguide structure.

Referring to FIGS. 2-8, one embodiment is now described with reference to the formation of a portion of a pixel cell 100 (FIG. 2). Throughout the drawings, like reference numbers are used consistently for like features. For illustrative purposes, the embodiment is described with reference to a pixel cell 100 for a CMOS image sensor. It should be readily understood that embodiments can also apply to CCD and other image sensors. In addition, the embodiment is described as forming a single pixel cell 100, but as mentioned above, fabrication of all pixel cells in an image sensor can proceed simultaneously.

Figure 3:
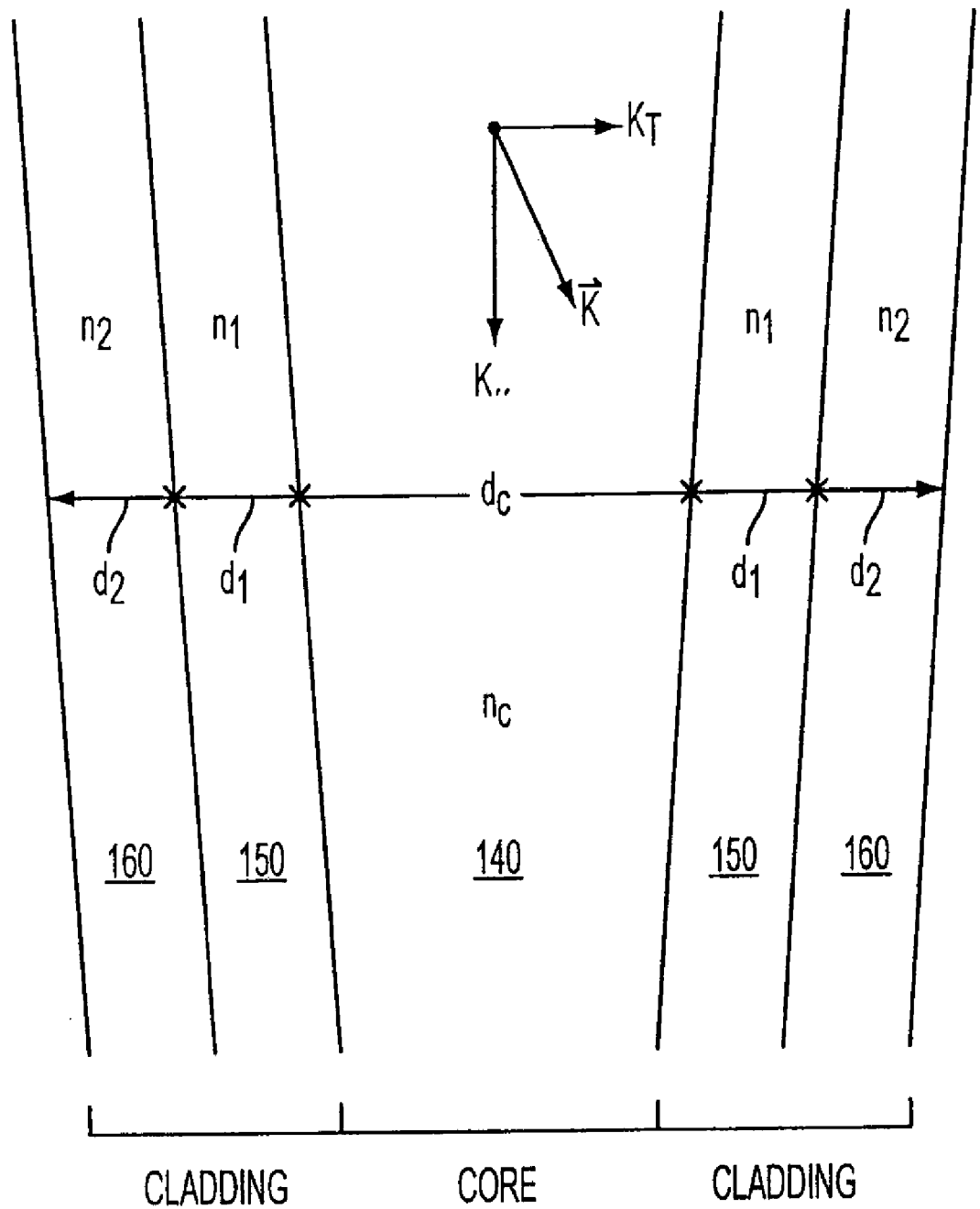
FIG. 3 illustrates the anti-resonant reflecting optical waveguide principle utilized in FIG. 2.

Each pixel cell 100 includes a photo-conversion device 120 formed in a semiconductor substrate 110, protective layers 170, 320 formed over an active area of the pixel cell 100, and an anti-resonant reflecting optical waveguide structure 130 for guiding light down to the photo-conversion device 120. The anti-resonant reflecting optical waveguide structure 130 is formed within interlayer dielectric (ILD) layers 340, 360, 380 containing metallization layers 330, 365, 350. Each anti-resonant reflecting optical waveguide structure 130 comprises a core 140 and at least one cladding structure 150 having a refractive index higher than the refractive index of the core 140. The cladding structures 150, 160 act as Fabry-Perot cavities and allow light to be reflected in the transverse direction $k_T$ (FIG. 3). The core 140 is filled with an optically transparent material. A passivation layer 390 is formed over the uppermost ILD layer 380. An optional color filter array 180 is formed over the passivation layer and the anti-resonant reflecting optical waveguide structure 130 if the pixel cell 100 is being used to detect color (e.g., red, blue, green). Otherwise, color filter array 180 is not required. An optional lens structure 190 may also be disposed above the optional color filter array 180 to focus light toward the photo-conversion device 120.

The anti-resonant reflecting optical waveguide principle is depicted in FIG. 3. The lower refractive index core 140 is surrounded by the higher refractive index cladding structure 150 with a thickness chosen such that the cladding structure 150 acts as a highly reflective Fabry-Perot cavity for the transverse wave vector $k_T$. Multiple cladding structures 150, 160 can be used to further reduce the leakage of light that enters the core 140 of the anti-resonant reflecting optical waveguide structure 130 (FIG. 2). The minimum thickness $d_i$ (FIG. 2) for each cladding structure can be approximated using the following equation:

$$d_i = \frac{\lambda}{4\sqrt{(n_i^2 - n_c^2) + \frac{\lambda^2}{4d_c^2}}} \quad (1)$$

wherein $d_i$ is the thickness of the $i^{th}$ cladding structure, $n_i$ is the index of refraction of the $i^{th}$ cladding structure, $n_c$ is the index of refraction of the core 140, $\lambda$ is a light wavelength, and $d_c$ (FIG. 2) is the average width of the core 140.

In FIG. 3, subscript 1 corresponds to cladding structure 150, subscript 2 corresponds to cladding structure 160, and subscript c corresponds to the core 140. Specifically, $d_1$ represents the thickness and $n_1$ represents the refractive index of cladding structure 150; $d_2$ represents the thickness and $n_2$ represents the refractive index of cladding structure 160; and $d_c$ represents the average thickness and $n_c$ represents the refractive index of core 140. In addition, $k_T$ represents the wave vector in the transverse direction as shown in FIG. 3 and $\overline{k}$ represents the direction of light entering the core 140 of the anti-resonant reflecting optical waveguide structure 130.

The cladding structure 150, 160 thickness for all pixel cells 100 (FIG. 2) having the anti-resonant reflecting optical waveguide structure 130 can be approximated by selecting the value of $\lambda$ to be a wavelength of interest. Alternatively, the anti-resonant reflecting optical waveguide structure 130 of a pixel 100 can be individually tailored based on the color associated with the pixel 100. For each color (i.e., red, green or blue) pixel cell 100, the cladding structure 150, 160 thickness is approximated by selecting the value of $\lambda$ accordingly. In general, however, the effect of the value of $\lambda$ in approximating the cladding structure 150, 160 thickness, if selected from the visible light range (approximately 0.4 μm-0.7 μm), is relatively small because the fabrication tolerance for the cladding structure 150, 160 thickness can easily cover the visible light range and ensure low optical loss.

FIGS. 4-8 depict process steps for forming the pixel cell 100 of FIG. 2. No particular order is required for any of the actions described herein, except for those logically requiring the results of prior actions. Accordingly, while the actions below are described as being performed in a general order, the order is but one example embodiment of the invention and can be altered.

Figure 4:
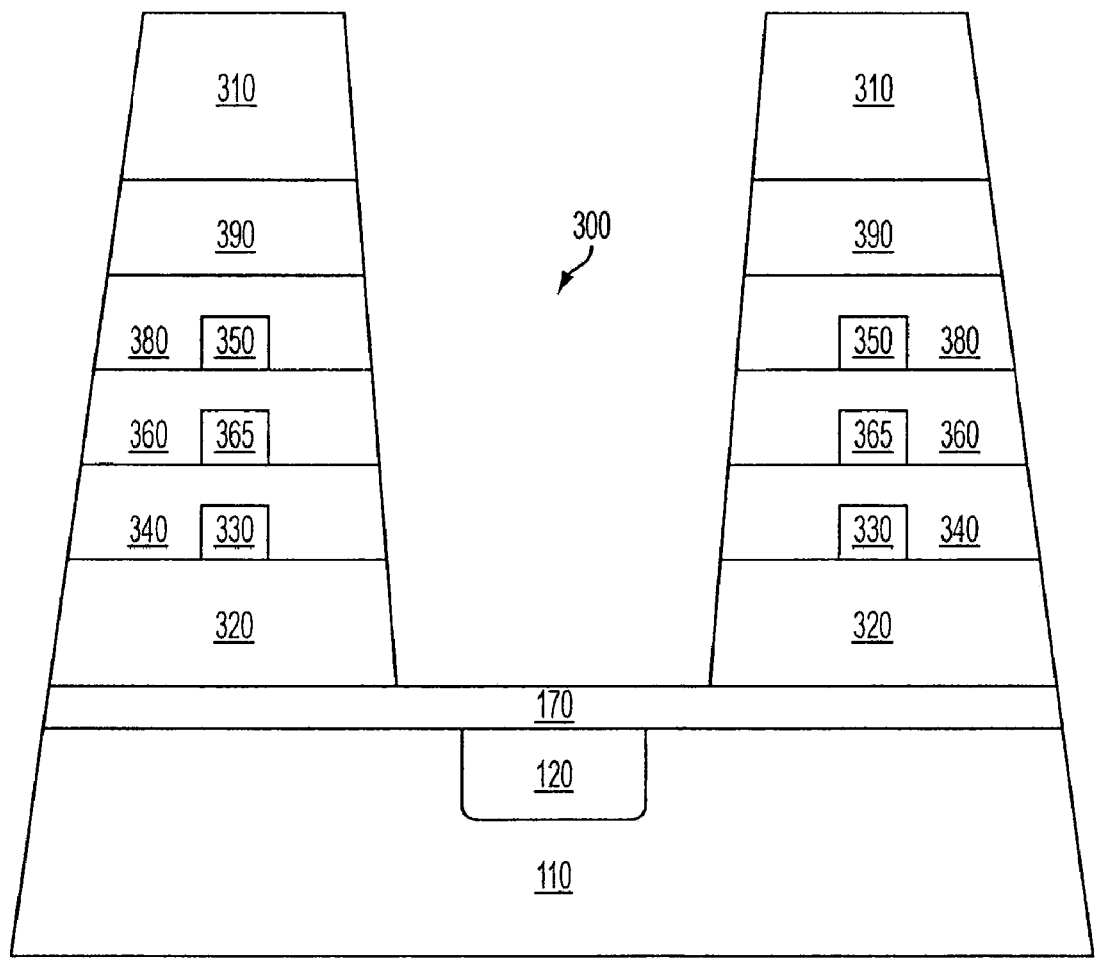
FIGS. 4-8 are schematic cross-sectional views of the pixel cell in FIG. 2 in various intermediate stages of fabrication.

Referring to FIG. 4, the photo-conversion device 120 is formed in the substrate 110 by any method. Protective layers 170, 320 typically formed of silicate material such as borophosphosilicate glass (BPSG) or tetraethyl orthosilicate (TEOS), are formed over the substrate 110 and the photo-conversion device 120. Although FIG. 4 illustrates two protective layers, any number of protective layers may be formed over the substrate 110 and the photo-conversion device 120, including a single protective layer or multiple protective layers. Moreover, each protective layer 170, 320 may be formed of a different material or the same material.

ILD layers 340, 360, 380 and metallization layers 330, 365, 350 are formed over the upper most protective layer 320 by any known method. The ILD layers 340, 360, 380 and the metallization layers 330, 365, 350 are collectively referred to herein as the ILD region. Although FIG. 4 depicts a limited number of ILD layers 340, 360, 380 and metallization layers 330, 365, 350, any number of such layers may be formed as necessary. Moreover, the ILD region may contain additional layers and/or structures other than ILD layers 340, 360, 380 and metallization layers 330, 365, 350. Any suitable material and technique may be used to form the various layers and/or structures within the ILD region. For simplicity, only the passivation layer 390, the ILD layers 340, 360, 380 and the metallization layers 330, 365, 350 are depicted in FIG. 4.

Referring again to FIG. 4, a patterned resist 310 is applied above the passivation layer 390 using, for example, photolithography techniques to create a resist pattern in which the location for the anti-resonant reflecting optical waveguide structure 130 (FIG. 2) is exposed for etching. Preferably, each photo-conversion device 120 has a corresponding anti-resonant reflecting optical waveguide structure 130 (FIG. 2) that is substantially vertically aligned with and has approximately the same shape as the photo-conversion device 120 when viewed from a top-down perspective. Alternatively, the resist layer 310 can be patterned to form an anti-resonant reflecting optical waveguide structure 130 (FIG. 2) having any desired cross-sectional shape. For example, the anti-resonant reflecting optical waveguide structure 130 (FIG. 2) may have a circular cross-sectional shape such that the overall anti-resonant reflecting optical waveguide structure 130 (FIG. 2) is substantially cylindrical. Other alternatives include rectangular and pentagonal cross-sectional shapes.

Figure 5:
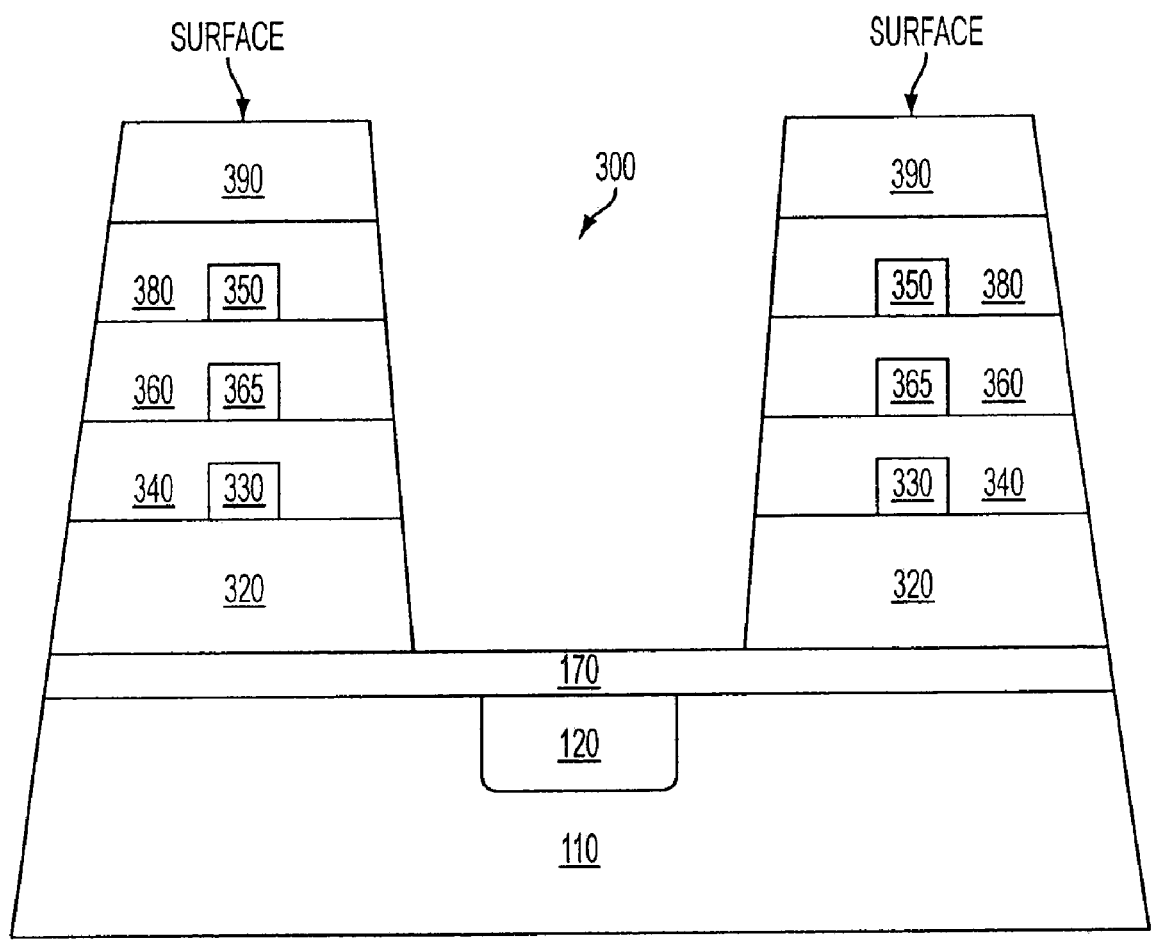

The uncovered parts of the passivation layer 390 and the ILD layers 340, 360, 380 are etched away using any etching technique to form a trench 300 above each photo-conversion device 120. Preferably, the trench 300 is dry etched. The depth, width and overall shape of the trench 300 can be tailored depending on the need, and may extend through any number of layers present above the photo-conversion device 120. In one embodiment, the trench 300 begins at a level below a later formed optional color filter array 180 (FIG. 2) and extends through the ILD layers 340, 360, 380 down to the protective layer 170 formed over the photo-conversion device 120. Once the etching process is complete, the resist 310 (FIG. 4) is removed and the surface of the structure shown in FIG. 5 is strip cleaned.

Figure 6:
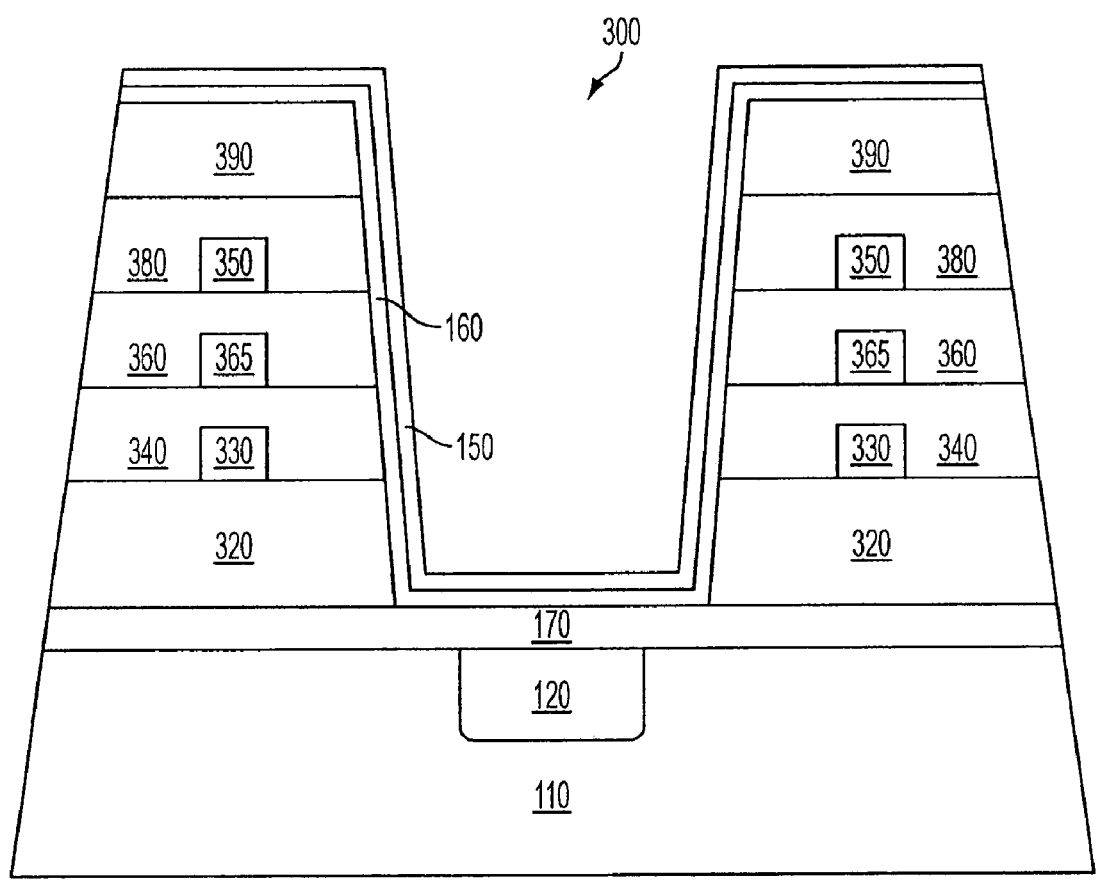

Referring to FIG. 6, each trench 300 is lined with a first optically transparent material 160m, which forms the outer cladding structure 160 (FIG. 2) of the anti-resonant reflecting optical waveguide structure 130 (FIG. 2). Another optically transparent material 150m, which forms the inner cladding structure 150 (FIG. 2) of the anti-resonant reflecting optical waveguide structure 130 (FIG. 2), is deposited over material 160. The optically transparent materials 160m, 150m can be deposited by any deposition technique known in the art, such as physical vapor deposition (PVD), direct current (DC) sputter deposition or radio frequency (RF) sputter deposition. Suitable materials for cladding structures 150, 160 are described below.

As previously mentioned in reference to FIG. 3, the deposition thickness of materials 160m, 150m lining the trench 300 can be determined using equation (1). Although FIG. 2 shows only two cladding structures 150, 160, additional cladding structures can further reduce the leakage of light that enters the core 140 (FIG. 2) of the anti-resonant reflecting optical waveguide structure 130 (FIG. 2). Generally, two to six cladding structures are preferable for reducing optical crosstalk without unduly burdening the process flow.

In order to utilize the anti-resonant reflecting optical waveguide principle, the refractive index of material 150m must be higher than the refractive index of material 160m and of the material used to fill the core 140 (FIG. 2). This difference in refractive index allows the respective cladding structures 160, 150 (FIG. 2) to function as Fabry-Perot cavities that are anti-resonant for the wave vector in the transverse direction $k_T$ (FIG. 3). Consequently, light entering the anti-resonant reflecting optical waveguide structure 130 (FIG. 2) will be subject to reflection in the transverse direction such that the light remains confined to the core 140 (FIG. 2). Moreover, the anti-resonant reflecting optical waveguide structure, compared to an optical waveguide that operates under the principle of total internal reflection, is not limited by the angle of incident light (i.e., light entering the anti-resonant reflecting optical waveguide structure need not be at an angle greater than a critical angle for reduction of optical crosstalk to occur). Typically, Fabry-Perot cavities are designed to have a narrow band of wavelengths for resonance. The anti-resonant reflecting optical waveguide structure 130 in FIG. 2, however, is operated as an anti-resonant Fabry-Perot cavity, which means light traveling back and forth in the cavity is out of phase resulting in destructive interference. A destructive cavity brings transmission intensity of light to a minimum (or reflection intensity of light to a maximum) and is spectrally broad. In other words, the anti-resonant reflecting optical waveguide structure 130 (FIG. 2) will confine a broad range of wavelengths within the core 140 (FIG. 2) while minimizing any loss through leakage.

Material 150m can be any optically transparent material so long as its refractive index is higher than that of material 160m and of the material used to fill the core 140 (FIG. 2). For example, $Si_xN_y$ (such as $Si_3N_4$), $Si_{1-x}Ti_xO_2$, and $SiO_2$ doped with elements that increase the refractive index are suitable as cladding structure 150, while $SiO_2$ is suitable as cladding structure 160. Preferably, material 150m is $Si_xN_y$, which has a refractive index of approximately 2.05, and material 160m is $SiO_2$, which has a refractive index of approximately 1.45. $Si_xN_y$ and $SiO_2$ are particularly desirable due to their compatibility with silicon microfabrication and the potential for further integration.

Figure 7:
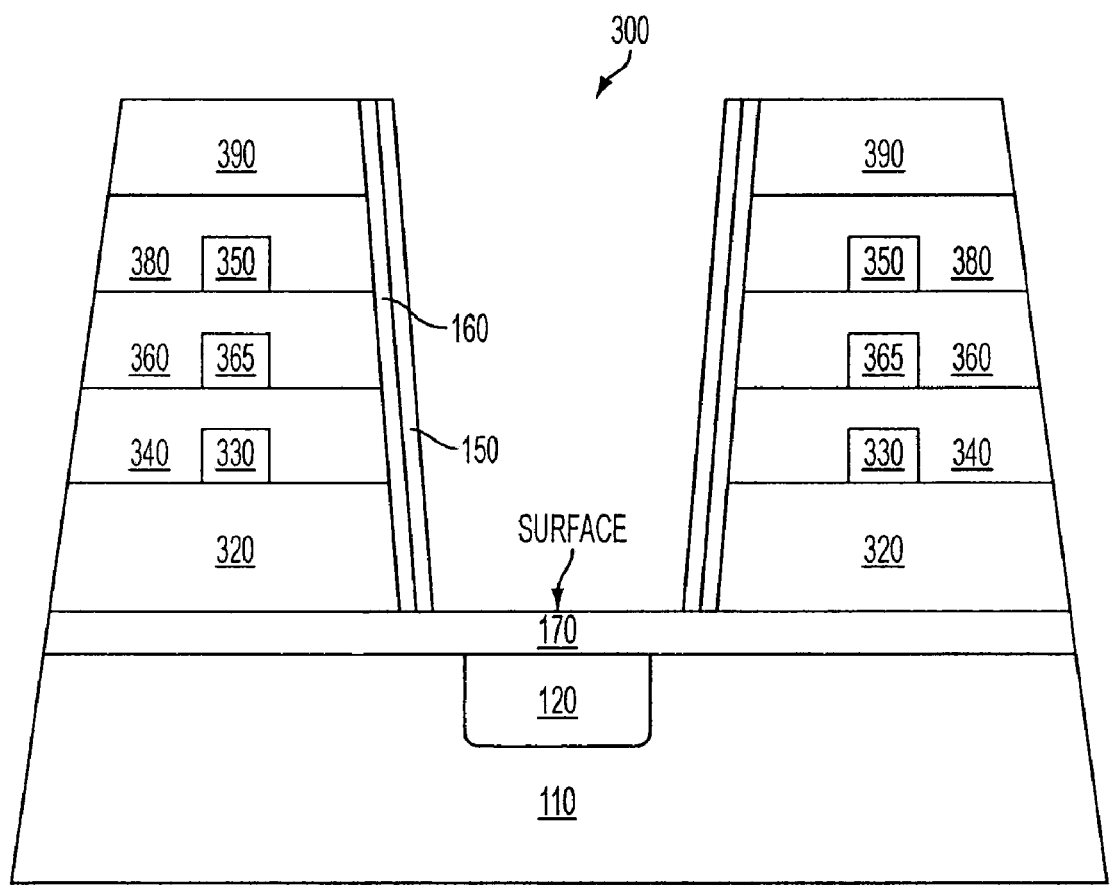

Referring to FIG. 7, materials 160m, 150m deposited over the passivation layer 390 and over the photo-conversion device 120 are removed using known techniques in the art to expose the surface of the passivation layer 390 and the surface of the protective layer 170, respectively. In one embodiment, materials 160m, 150m are dry etched such that the materials 160m, 150m remain only on the sidewalls of the trench 300. The dry etching of the materials 160m, 150m is similar to the spacer etch process used in forming complementary metal oxide semiconductors (CMOS).

Figure 8:
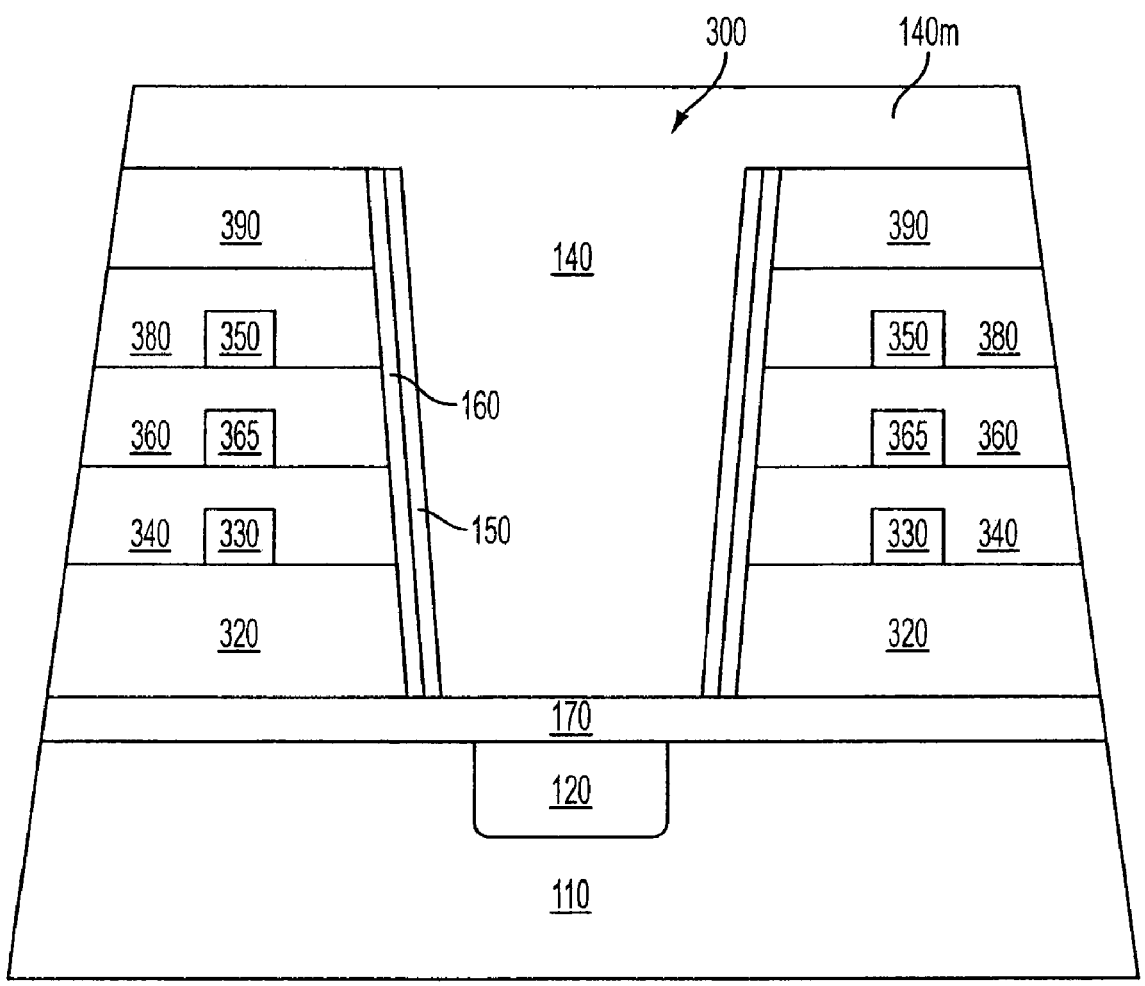

In FIG. 8, the trench 300 is filled with an optically transparent core material 140m which has a lower refractive index than cladding structure 150. The core 140 and the cladding structures 160, 150 should be optically transparent to avoid light absorption. The core material 140m can be, for example, a polymer or $SiO_2$. If a polymer is selected as the core material 140m, the refractive index of the polymer must be lower than the refractive index of the cladding structure 150 immediately surrounding the core 140 (FIG. 2). In one embodiment, the core 140 is formed of $SiO_2$ because of its compatibility with silicon microfabrication and the potential for further integration.

The intermediate structure of FIG. 8 is then planarized using a chemical-mechanical planarization (CMP) process to remove a portion of the core material 140m and expose the surface (FIG. 5) of the passivation layer 390. This process is followed by forming an optional color filter array 180, and an optional lens structure 190 to complete the structure shown in FIG. 2.

Figure 9:
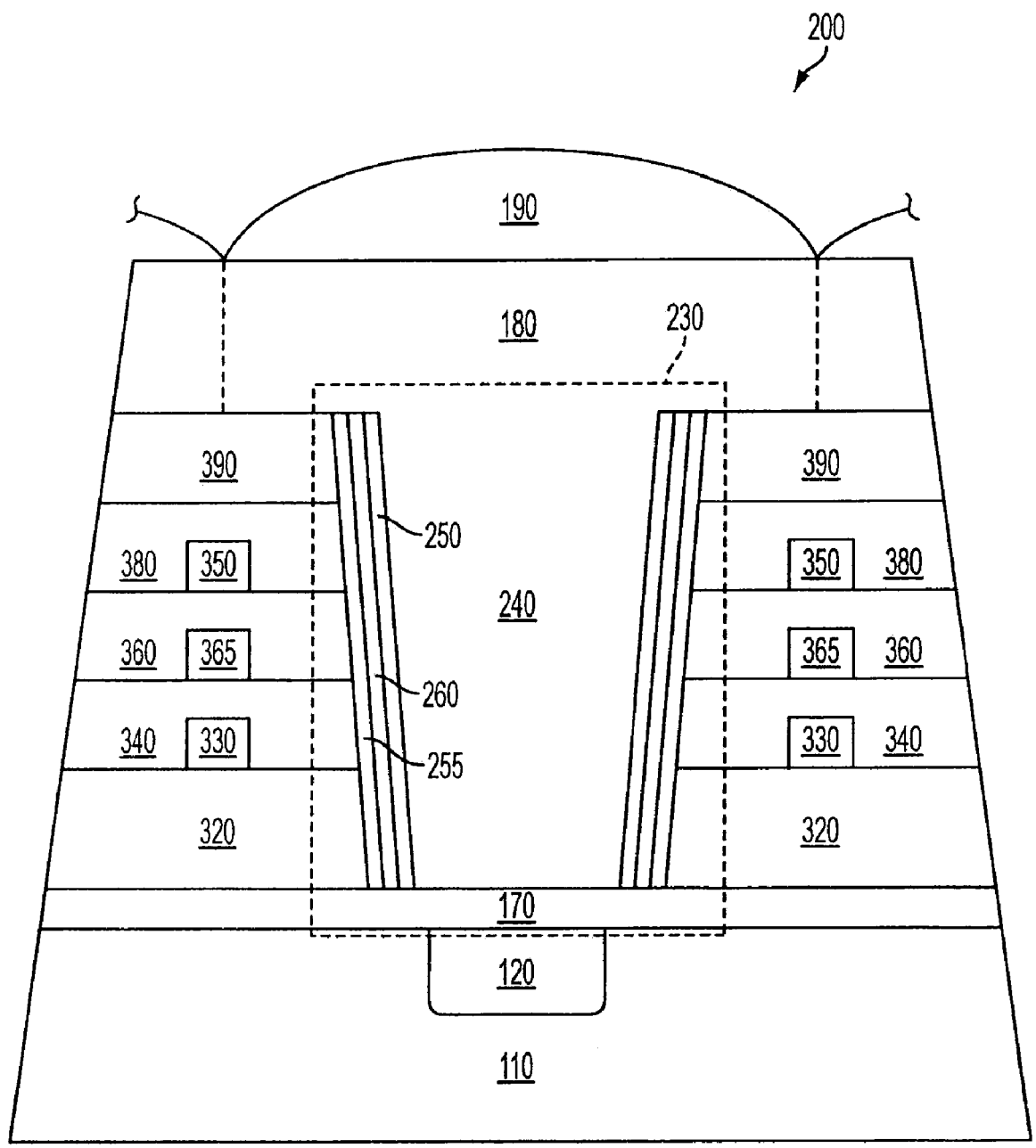
FIG. 9 is a schematic cross-sectional view of a pixel cell having an anti-resonant reflecting optical waveguide structure in accordance with another embodiment described herein.

FIG. 9 illustrates another embodiment of a pixel cell 200 having an anti-resonant reflecting optical waveguide structure 230 for guiding light down to a photo-conversion device 120. Each pixel cell 200 includes the photo-conversion device 120 formed in a semiconductor substrate 110, protective layers 170, 320 formed over an active area of the pixel cell 200, and an anti-resonant reflecting optical waveguide structure 230 formed over the photo-conversion device 120. Each anti-resonant reflecting optical waveguide structure 230 comprises a core 240 and two cladding structures 250, 255 having a refractive index higher than the refractive index of the core 240 and one cladding structure 260 having a refractive index lower than the refractive index of the cladding structures 250, 255. Specifically, each cladding structure 250, 260, 255 has a different refractive index such that cladding structures 250, 255 have higher refractive indices relative to cladding structure 260 and the core 240. The cladding structures 250, 260, 255 act as Fabry-Perot cavities and allow light to be reflected in the transverse direction $k_T$ (FIG. 3), such that the light entering the anti-resonant reflecting optical waveguide structure 230 is confined to the core 240. Accordingly, optical crosstalk is reduced.

Figure 10:
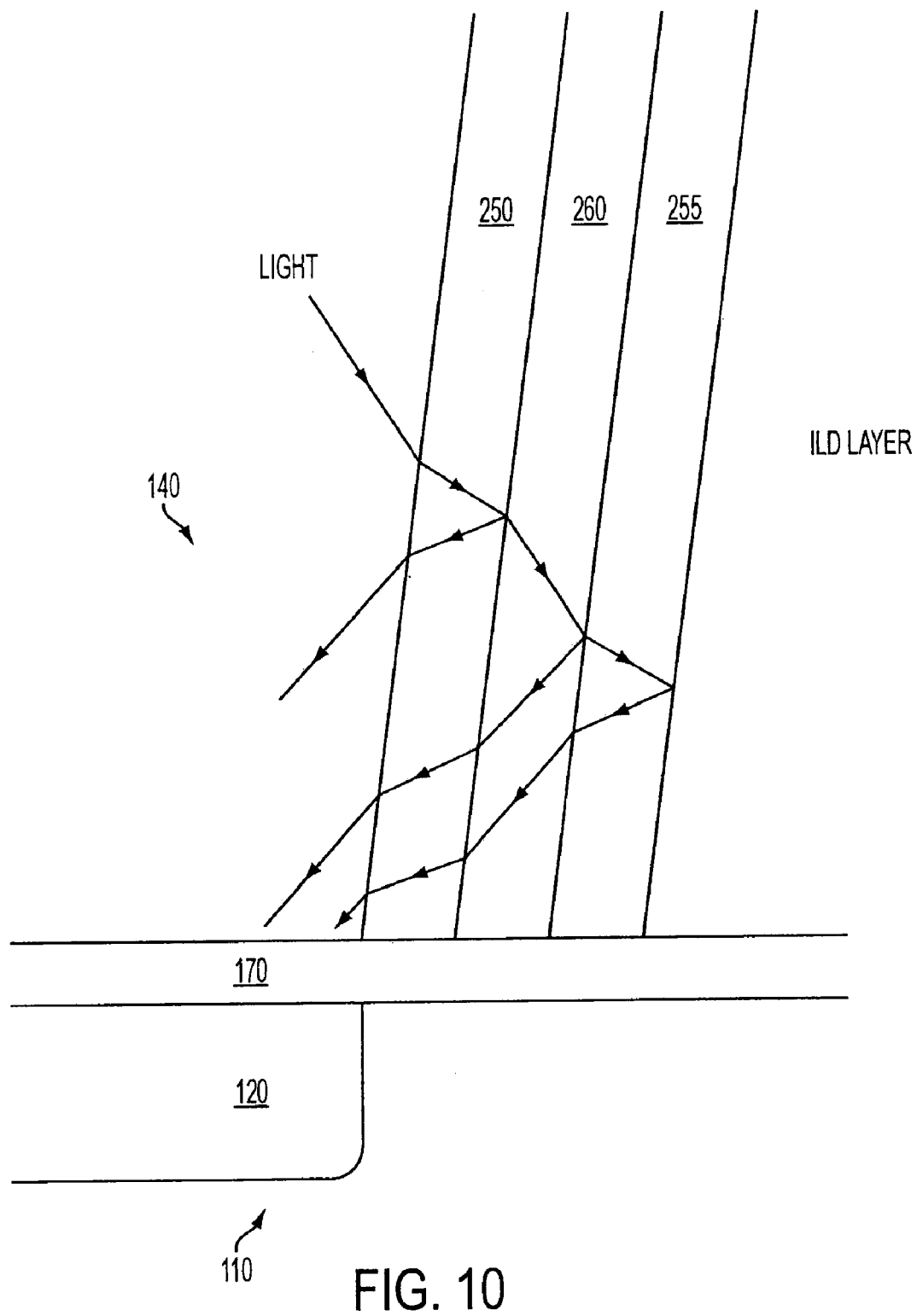
FIG. 10 is a schematic diagram illustrating how the pixel cell of FIG. 9 reduces optical crosstalk.

The cladding structures 250, 260, 255 and the core 240 in FIG. 9 can be formed of any material previously mentioned with respect to FIG. 2. For example, the core 240 and cladding structure 260 may be formed of $SiO_2$, which has a refractive index of approximately 1.45, and cladding structures 250 and 255 may be formed of $Si_xN_y$, which has a refractive index of approximately 2.05. Light entering the anti-resonant reflecting optical waveguide structure 230 of FIG. 9 follows the paths represented by the arrows in FIG. 10.

Returning to FIG. 9, the anti-resonant reflecting optical waveguide structure 230 is formed within ILD layers 340, 360, 380 containing metallization layers 330, 365, 350. A passivation layer 390 is formed over the uppermost ILD layer 380 of each pixel cell 200. An optional color filter array 180 is formed over the passivation layer and the anti-resonant reflecting optical waveguide structure 230 if the pixel cell 200 is being used to detect color (e.g., red, blue, green). Otherwise, color filter array 180 is not required. An optional lens structure 190 may also be disposed above the optional color filter array 180 to focus light toward the photo-conversion device 120. It should be noted that the same or similar process steps for forming pixel cell 100 of FIG. 2 can be used for forming pixel cell 200 of FIG. 9 or a pixel cell with more than three cladding structures.

Figure 11:
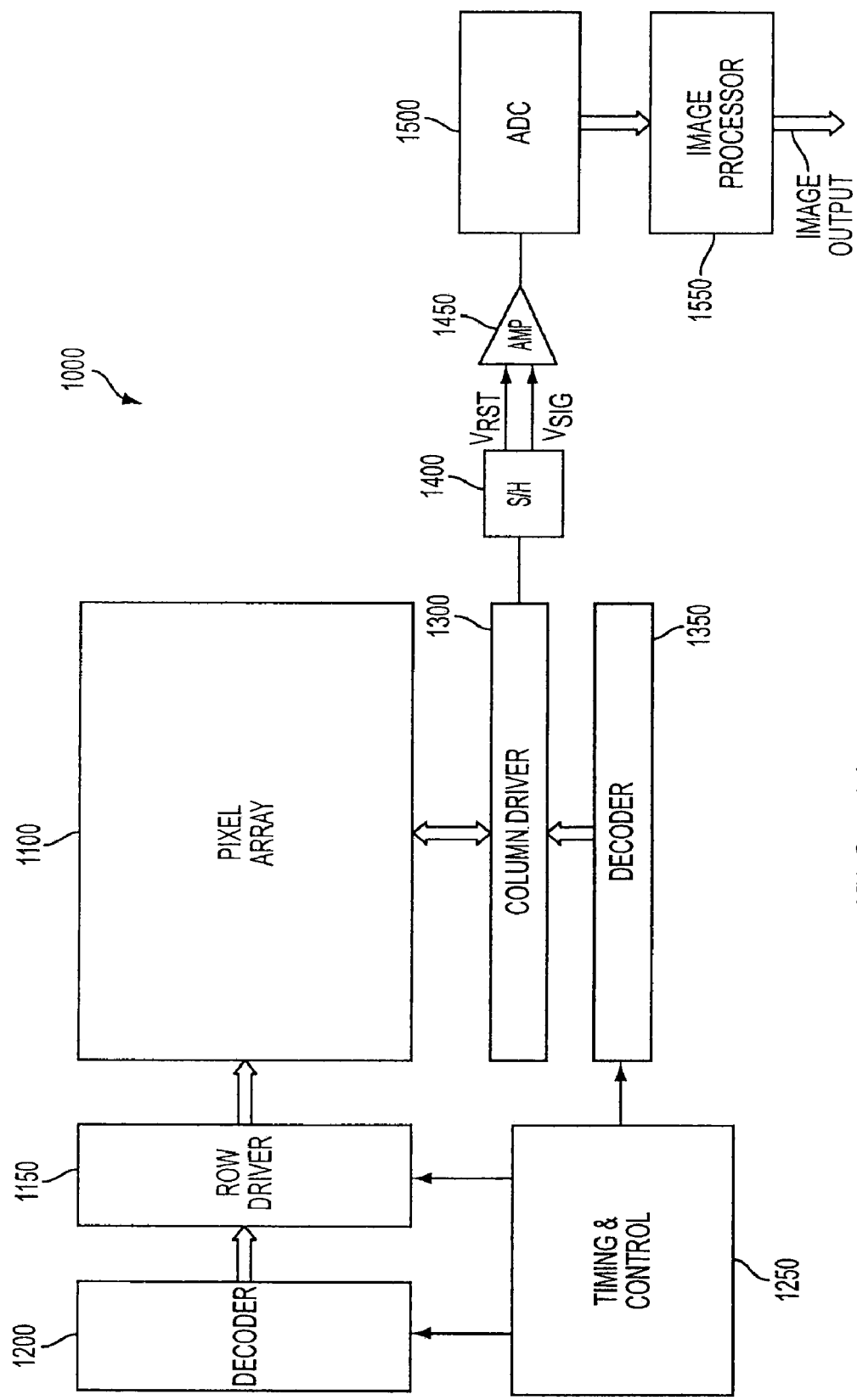
FIG. 11 is a block diagram of an image sensor according to an embodiment described herein.

FIG. 11 illustrates a CMOS image sensor 1000 that includes an array 1100 of pixel cells 100, 200 constructed according to an embodiment. That is, each pixel cell 100, 200 uses the structure illustrated in FIG. 2 or FIG. 9. The array 1100 is arranged in a predetermined number of columns and rows. The pixel cells 100, 200 of each row are selectively activated in response to row select lines. Similarly, pixel cells 100, 200 of each column are selectively readout in response to column select lines. The row select lines in the array 1100 are selectively activated by a row driver 1150 in response to a row address decoder 1200 and the column select lines are selectively activated by a column driver 1300 in response to a column address decoder 1350. The array 1100 is operated by the timing and control circuit 1250, which controls the address decoders 1200, 1350 for selecting the appropriate row and column lines for pixel signal readout.

A sample and hold circuit 1400 associated with the column driver 1300 reads a pixel reset signal (Vrst) and a pixel image signal (Vsig) for selected pixels. A differential signal (Vrst-Vsig) is then amplified by a differential amplifier 1450 for each pixel cell and each pixel cell's differential signal is digitized by an analog-to-digital converter 1500 (ADC). The analog-to-digital converter 1500 supplies the digitized pixel signals to an image processor 1550, which performs various processing functions on image data received from array 1100 and forms a digital image for output.

Figure 12:
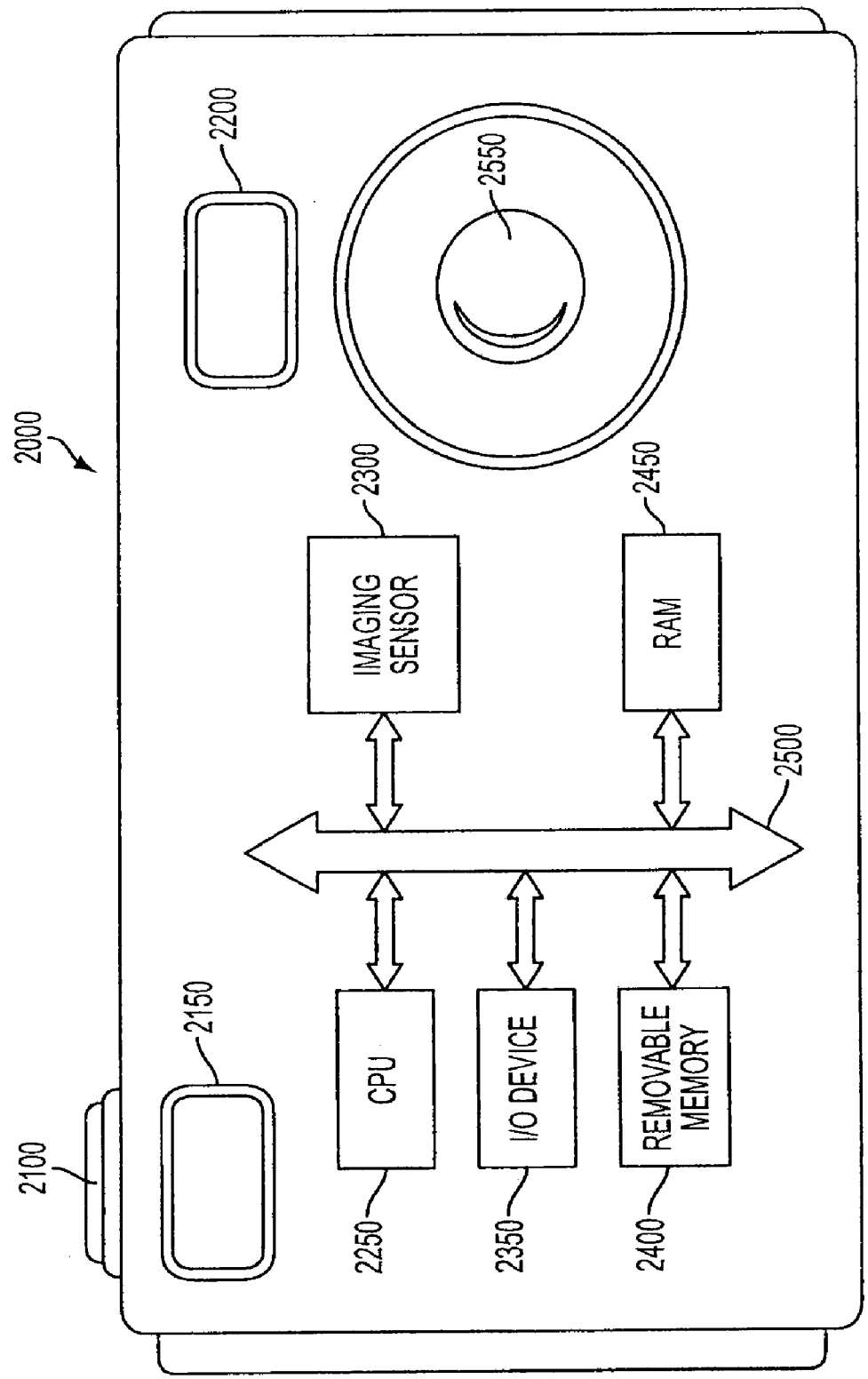
FIG. 12 is a block diagram of a processing system including the image sensor of FIG. 11.

FIG. 12 is a block diagram of a processing system, e.g., a camera system, 2000 incorporating an image sensor 2300 in accordance with the embodiments described herein. A camera system 2000 generally comprises a shutter release button 2100, a view finder 2150, a flash 2200 and a lens system 2550. A camera system 2000 generally also comprises a camera control central processing unit (CPU) 2250, for example, a microprocessor, that controls camera functions and communicates with one or more input/output (I/O) devices 2350 over a bus 2500. The CPU 2250 also exchanges data with random access memory (RAM) 2450 over bus 2500, typically through a memory controller. The camera system may also include peripheral devices such as a removable flash memory 2400 which also communicates with CPU 2250 over the bus 2500. The processing system illustrated in FIG. 12 need not be limited to a camera, but could include any system which receives and operates with image data provided by the image sensor 2300.

The above description and drawings are only to be considered illustrative of specific embodiments, which achieve the features and advantages described herein. Modification and substitutions to specific process conditions and structures can be made. Accordingly, the embodiments are not to be considered as being limited by the foregoing description and drawings, but is only limited by the scope of the appended claims.

What is claimed as new and desired to be protected by Letters Patent of the United States is:

1. A pixel cell comprising:
   a photo-conversion device formed in association with a substrate;
   a plurality of material layers over said substrate; and
   an anti-resonant reflecting optical waveguide structure formed over said photo-conversion device and within said plurality of material layers, said waveguide structure comprising:
      a trench within at least a portion of said plurality of material layers;
      a plurality of cladding structures formed along a sidewall of said trench, said plurality of cladding structures being contiguous with each other along at least the entire length of said trench sidewall; and
      a core material formed in contact with an innermost one of said plurality of cladding structures and filling a remaining portion of said trench, wherein a refractive index of said core material is lower than a refractive index of the innermost cladding structure and wherein a refractive index of a second cladding structure in contiguous contact with said innermost cladding structure is lower than said refractive index of said innermost cladding structure.

2. The pixel cell of claim 1, wherein said trench is substantially vertically aligned with said photo-conversion device.

3. The pixel cell of claim 1 wherein cross-sectional shapes of said trench and said photo-conversion device are approximately the same.

4. The pixel cell of claim 2, wherein said trench has a circular cross-sectional shape.

5. The pixel cell of claim 1, wherein said plurality of cladding structures and said core material are optically transparent.

6. The pixel cell of claim 1, wherein said plurality of cladding structures comprise one or more of $Si_xN_y$, $Si_{1-x}Ti_xO_2$.

7. The pixel cell of claim 1, wherein said core material comprises one or more of a polymer or $SiO_2$.

8. The pixel cell of claim 1, wherein said core material is $SiO_2$ and said plurality of cladding structures alternate between $Si_xN_y$ and $SiO_2$.

9. An image sensor comprising:
   an array of pixel cells, each said pixel cell comprising:
      a photo-conversion device formed in association with a substrate;
      a Fabry-Perot cavity formed over said photo-conversion device, said Fabry-Perot cavity comprising a trench and at least two contiguous cladding structures formed over sidewalls of said trench; and
      an optically transparent core material filling said Fabry-Perot cavity, said core material being substantially vertically aligned with said photodiode and in contact with an innermost of said at least two contiguous cladding structures.

10. The image sensor of claim 9, wherein said core material is optically transparent.

11. A system comprising:
   an image sensor comprising an array of pixel cells; and an image processor for processing image signals produced by said image sensor, wherein each said pixel cell of said image sensor comprises:

a photo-conversion device formed in a substrate, and
an anti-resonant reflecting optical waveguide structure formed over and being substantially vertically aligned with said photo-conversion device, said waveguide structure comprising:
a core,
an inner cladding structure surrounding and in contact with said core, and
at least one outer cladding structure surrounding said inner cladding structure, wherein a refractive index of said inner cladding structure is higher than a refractive index of said core, wherein said inner and outer cladding structures are contiguous with each other along at least the entire length of sidewalls of said anti-resonant reflecting optical waveguide structure.

12. The system of claim 11, wherein said inner cladding structure comprises one or more of $Si_xN_y$, $Si_{1-x}Ti_xO_2$, and doped $SiO_2$.

13. The system of claim 11, wherein said core comprises one or more of a polymer or $SiO_2$.

14. A method of forming a pixel cell, said method comprising:
forming a photo-conversion device in a substrate;
forming a plurality of material layers over said substrate; and
forming an anti-resonant reflecting optical waveguide structure over said photo-conversion device and within said plurality of material layers, the act of forming said waveguide structure comprising:
forming a trench within at least a portion of said plurality of material layers,
forming a plurality of cladding structures along a sidewall of said trench, said plurality of cladding structures being contiguous with each other along at least the entire length of said trench sidewall, and
forming a core material over said plurality of cladding structures to fill a remaining portion of said trench, wherein a refractive index of said core material is lower than a refractive index of a first cladding structure in contact with said core material, and wherein a refractive index of said first cladding structure is higher than a refractive index of a second cladding structure in contact with said first cladding structure.

15. The method of claim 14, wherein said trench is substantially vertically aligned with said photo-conversion device.

16. The method of claim 14, wherein said trench has a circular cross-sectional shape.

17. The method of claim 14, wherein said plurality of cladding structures and said core material are optically transparent.

18. The method of claim 14, wherein said plurality of cladding structures comprise one or more of $Si_xN_y$, $Si_{1-x}Ti_xO_2$, and doped $SiO_2$.

19. The method of claim 14, wherein said core material comprises one or more of a polymer or $SiO_2$.

20. The method of claim 14, wherein the act of forming a plurality of cladding structures comprises alternating between $Si_xN_y$ and $SiO_2$.

* * * * *